United States Patent [19]

Tran et al.

[11] Patent Number: 5,135,581
[45] Date of Patent: Aug. 4, 1992

[54] LIGHT TRANSMISSIVE ELECTRICALLY CONDUCTIVE OXIDE ELECTRODE FORMED IN THE PRESENCE OF A STABILIZING GAS

[75] Inventors: Nang T. Tran, Cottage Grove; James R. Gilbert, Maplewood, both of Minn.

[73] Assignee: Minnesota Mining and Manufacturing Company, St. Paul, Minn.

[21] Appl. No.: 682,542

[22] Filed: Apr. 8, 1991

[51] Int. Cl.$^5$ .................. H01L 31/06; H01L 31/0224
[52] U.S. Cl. ................................ 136/256; 136/258; 204/192.29; 204/298.07; 204/298.11; 204/298.24; 252/518; 357/30; 357/65
[58] Field of Search ............... 204/192.29; 252/518, 252/520, 521; 136/256, 258 AM; 357/30 J, 30 Q, 65; 428/432

[56] References Cited

U.S. PATENT DOCUMENTS

| | | | |
|---|---|---|---|
| 2,628,927 | 2/1953 | Colbert et al. | 428/336 |
| 4,400,254 | 8/1983 | Freller et al. | 204/192.29 |
| 4,532,537 | 7/1985 | Kane | 357/30 |
| 4,623,601 | 11/1986 | Lewis et al. | 430/69 |
| 4,940,495 | 7/1990 | Weber et al. | 136/256 |
| 4,990,286 | 2/1991 | Gordon | 252/518 |

OTHER PUBLICATIONS

G. L. Harding et al., *Solar Energy Materials*, vol. 20, pp. 367-379 (1990).
L. Vasanelli et al., *Solar Energy Materials*, vol. 16, pp. 91-102 (1987).
S. R. Kurtz et al., *Solar Energy Materials*, vol. 15, pp. 229-236 (1987).
Ishibashi et al., *J. Vac. Sci. Technol.* A 8(3), pp. 1399-1402 (May/Jun. 1990).
Minami et al., *Thin Solid Films*, 176, pp. 277-282 (1989).
(Abstract) Isamukhamedova et al., *Izv. Akad. Nauk Uzb. SSR*, Ser. Fiz.-Mat. Nauk (2) 67-8 (1982).

*Primary Examiner*—Aaron Weisstuch
*Attorney, Agent, or Firm*—Gary L. Griswold; Walter N. Kirn; David B. Kagan

[57] ABSTRACT

A light transmissive, electrically conductive oxide is doped with a stabilizing gas such as $H_2$ and $H_2O$. The oxide is formed by sputtering a light transmissive, electrically conductive oxide precursor onto a substrate at a temperature from 20° C. to 300° C. Sputtering occurs in a gaseous mixture including a sputtering gas and the stabilizing gas.

16 Claims, 3 Drawing Sheets

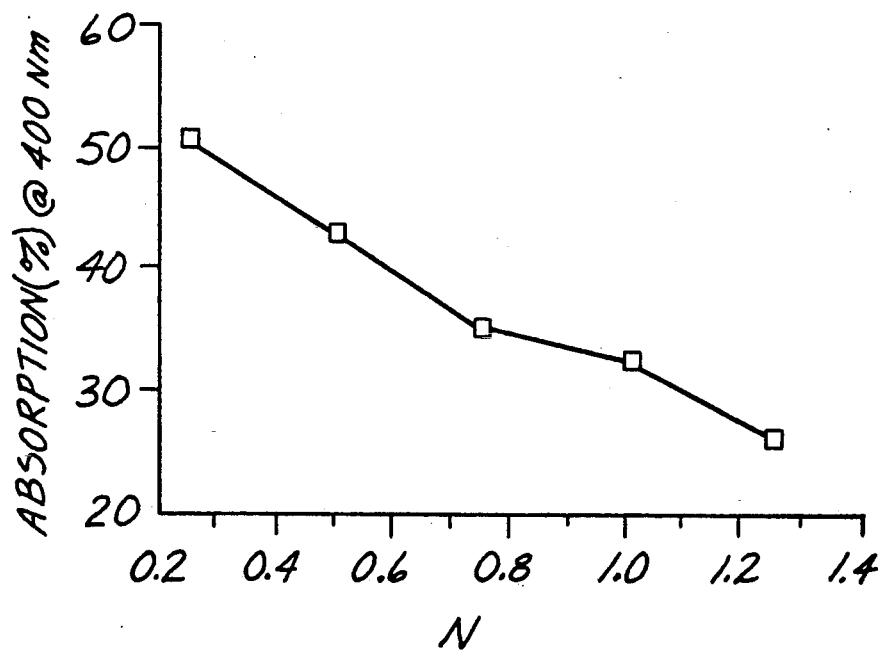

LIGHT TRANSMISSIVE ELECTRICALLY CONDUCTIVE OXIDE ELECTRODE FORMED IN THE PRESENCE OF A STABILIZING GAS

The government of the United States of America has rights in this invention pursuant to subcontract ZB-4-03056-2 awarded by the United States Department of Energy.

FIELD OF THE INVENTION

The present invention relates to light transmissive, electrically conductive compositions, and in particular to light transmissive, electrically conductive oxide compositions doped with a stabilizing gas.

BACKGROUND OF THE INVENTION

Many devices, such as photodiode detectors, photovoltaic devices, radiation detectors, liquid crystal displays, and the like, include light sensitive materials which convert incident light into electrical energy. Light transmissive electrodes play an important role in such devices. When placed in electrical contact with a light sensitive material, a light transmissive electrode allows incident light to pass through the electrode and strike the light sensitive material. The efficiency of devices, such as photodiode detectors, photovoltaic devices, radiation detectors, liquid crystal displays, and the like, in converting incident light into electrical energy depends in part upon the percentage of light that passes through the light transmissive electrode and reaches the light sensitive material.

Light transmissive electrodes have been formed in a variety of ways. Under one approach, a grid of spaced-apart metal conductors is formed on the surface of the light sensitive material. This approach provides good electrical contact with the light sensitive material. Unfortunately, however, the metal conductors block a significant portion of the incident light. Additionally, because the metal grid covers only a portion of surface of the light sensitive material, use of a metal grid increases the internal resistance to current flow from the light sensitive material to the electrode.

Another approach involves depositing a layer of a light transmissive, electrically conductive oxide onto the light sensitive material. Advantageously, this approach allows a very high percentage of incident light to pass through the electrode and strike the light sensitive material. Moreover, since the light transmissive, electrically conductive oxide may be deposited over the entire surface of the light sensitive material, any internal resistance to current flow from the light sensitive material to the electrode is substantially eliminated.

However, there are drawbacks to using the known light transmissive, electrically conductive oxides as electrodes. For example, deposition of the light transmissive, electrically conductive oxide onto the light sensitive material according to known techniques occurs at high temperatures, i.e., temperatures greater than about 300° C. At such high temperatures, the light transmissive, electrically conductive oxide tends to diffuse into the light sensitive material. Such diffusion can impair or even destroy the ability of the light sensitive material to convert incident light into electrical energy. Moreover, as a result of using such high temperatures, light transmissive, electrically conductive oxides cannot be deposited onto devices comprising flexible polymer supports since the polymer supports tend to undergo chemical and/or physical degradation at such high temperatures.

When deposited at low temperatures, i.e., temperatures below about 300° C., previously known light transmissive, electrically conductive oxide materials show higher resistivity and visible light absorption values relative to light transmissive, electrically conductive oxide materials deposited at higher temperatures. Moreover, when deposited at low temperatures, previously known light transmissive, electrically conductive oxide materials show a sharp increase in resistivity and absorption when exposed to air, especially when exposed to air at temperatures of about 100° C. or more. As a consequence, previously known light transmissive, electrically conductive oxide materials prepared at low temperatures have not been suitable for use as light transmissive electrodes.

SUMMARY OF THE INVENTION

The present invention is based on the discovery that the resistivity and visible light absorption characteristics of oxide films formed at low temperatures, e.g., from about 20° C. to about 300° C., are advantageously reduced as well as rendered more stable when such films are formed in the presence of fluorine containing gas and a stabilizing gas such as $H_2$ or $H_2O$.

In one aspect of the present invention relates to a process for making a light transmissive, electrically conductive composition. A light transmissive, electrically conductive oxide precursor is sputtered onto a substance at a temperature from 20° C. to 300° C. Sputtering occurs in a gaseous mixture comprising a sputtering gas and a stabilizing gas. According to the present invention, the stabilizing gas is a gas such as $H_2$ or $H_2O$. In preferred embodiments of the present invention, the gaseous mixture also includes oxygen and/or a fluorinated gas such as $F_2$, $CF_4$, and $BF_6$.

In another aspect, the present invention concerns a light transmissive, electrically conductive oxide. The oxide is doped with the stabilizing gas and, optionally, a fluorinated gas.

In another aspect, the present invention concerns a photovoltaic device. The photovoltaic device comprises a photovoltaic semiconductor structure having a first side and a second side. A first electrode is formed on the first side of the photovoltaic semi-conductor structure. The first electrode is formed of a conductive material and is in electrical contact with the first side of the photovoltaic semiconductor structure. A second electrode is formed on the second surface of the photovoltaic semiconductor structure. The second electrode comprises a light transmissive, electrically conductive oxide that is doped with a stabilizing gas and, optionally, a fluorinated gas. The second electrode is in electrical contact with the second surface of the photovoltaic semiconductor structure.

"Light transmissive" means that at least a majority of incident light is transmitted through the composition. The light transmissive characteristics of a composition may be measured by a Lambda 9 spectrophotometer commercially available from Perkin-Elmer Co. This device provides transmission, reflection, and absorption data in the wavelength range from 200 nm to 1000 nm.

The oxide compositions of the present invention are particularly suitable as light transmissive electrodes for use on devices such as solar cells, photodiode detectors, radiation detectors, and liquid crystal displays. Moreover, because the present invention provides a room temperature process, the present invention allows devices such as solar cells, photodiode detectors, radiation detectors, and liquid crystal displays to be prepared on flexible, polymer supports which would otherwise be damaged by high temperature processes.

BRIEF DESCRIPTION OF THE DRAWINGS

FIG. 1b is a top view of the sputtering system shown in FIG. 1a.

FIG. 5 is a graph of the absorption of the present invention at 400 nm as a function of N.

DESCRIPTION OF THE PREFERRED EMBODIMENTS

Figure 1A:
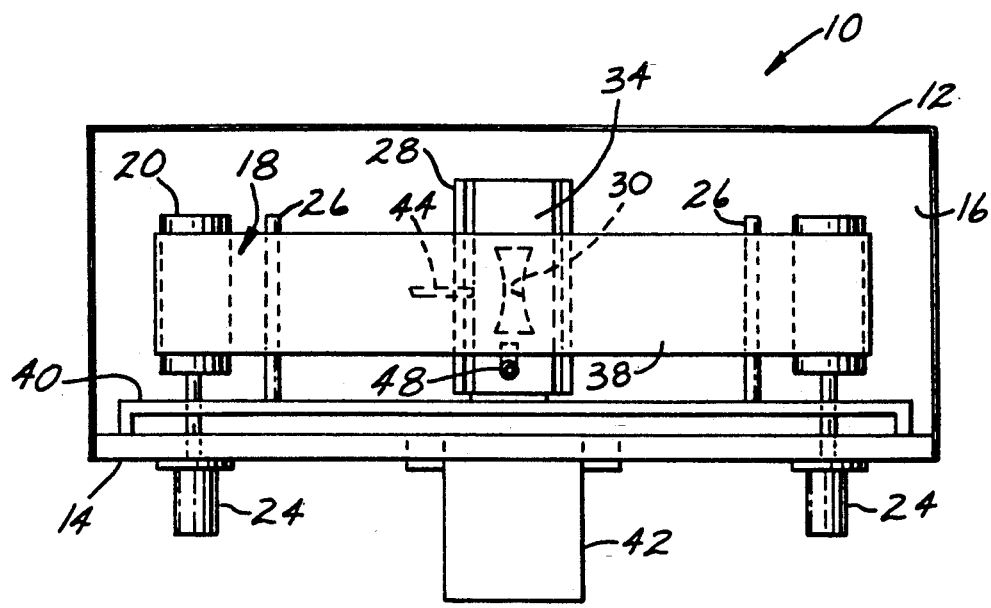
FIG. 1a is a side view of one sputtering system useful in the practice of the present invention.

Preferred examples of light transmissive, electrically conductive oxides suitable in the practice of the present invention include the well-known transparent conducting oxides. The transparent conducting oxides include materials such as ZnO optionally doped with Al, In, Ga or B; SnO, doped with at least one of F or Sb; indium tin oxide ($In_2O_3/SnO_2$); $CdSnO_4$; $TiO_2$ doped with F; and $SnTiO_3$. Of these materials, indium tin oxide and doped $SnO_2$ are preferred.

The light transmissive, electrically conductive oxides of the present invention are doped with a stabilizing gas. The stabilizing gas is at least one gas selected from $H_2$ and $H_2O$. Of these gases, the use of $H_2$ is preferred.

Using a stabilizing gas surprisingly reduces and stabilizes the resistivity and absorption characteristics of oxide compositions formed at low temperatures, i.e. temperatures less than about 300° C. Although the reason that the stabilizing gas reduces and stabilizes the resistivity and absorption characteristics of oxide compositions is not precisely known, a possible rationale can be suggested. It is believed that the presence of the stabilizing gas increases the oxygen vacancies in the crystal lattice structure of an oxide composition, thereby enhancing the deviation of the oxide composition from a stoichiometric composition. It is also believed that the stabilizing gas passivates defects in the grain boundaries of the oxide composition. The net result of these two effects is an increase in carrier concentration and an increase in mobility of the carriers. This, in turn, provides an oxide composition with lower resistivity.

Additionally, it is also believed that some of the stabilizing gas becomes immersed in the oxide composition in the form of interstitial H ions. In the absence of such interstitial H ions, oxygen in the ambient air can react with the metal ions in the oxide composition or fill oxygen vacancies in the crystal lattice structure, resulting in an increase in resistivity and/or absorption. However, when the H ions are present, oxygen in the ambient air tends to react with the H ions rather than reacting with the metal ions or filling oxygen vacancies in the crystal lattice structure. As the interstitial H ions are used up in reactions with oxygen, the amount of interstitial H ions immersed in the oxide film can be replenished by placing the oxide composition into a vacuum chamber comprising 50 millitorr or less of the stabilizing gas.

In short, it is believed that the interstitial H ions help protect the oxide composition against the damaging effects of oxygen in the ambient air. Indeed, practical tests have shown that preferred embodiments of the present invention show substantially no increase in resistivity or absorption even after having been stored in ambient conditions for 6 months, or even after having been annealed at 100° C. for 144 hours.

In preferred embodiments of the invention, the light transmissive, electrically conductive oxide may also be doped with a fluorine containing gas such as $F_2$, $CF_4$, and $BF_6$. Of these gases, the use of $CF_4$ is preferred. Practical tests have shown that doping the light transmissive, electrically conductive oxide with a fluorine containing gas provides a light transmissive, electrically conductive composition having lower resistivity and absorption characteristics than light transmissive, electrically conductive compositions doped only with the stabilizing gas.

The light transmissive, electrically conductive oxides of the present invention are preferably formed by sputtering a suitable precursor onto a substrate at a temperature from 20° C. to 300° C. in the presence of a gaseous mixture comprising a sputtering gas, the stabilizing gas, optionally $O_2$, gas, and, optionally, the fluorine containing gas. Preferably, sputter depositing occurs at a temperature of from 25° C. to 150° C., and more preferably at 25° C.

The particular substrate used in the practice of the present invention is not critical and may be any substrate known in the art upon which a light transmissive, electrically conductive oxide may be sputtered. As one example, the light transmissive, electrically conductive oxides of the present invention may form a transparent electrode in devices such as photovoltaic devices, photodiodes, radiation detectors, liquid crystal displays, and the like. As another example, the light transmissive, electrically conductive oxides of the present invention may be sputtered onto a polymer web to form a polymer sheet with a conductive surface.

The precursor may be any material known in the art to be suitable for forming light transmissive, electrically conductive oxides using the sputter depositing technique. Preferred precursors are the metal or metal oxides suitable for preparing the well-known transparent conducting oxides. Suitable precursors used to prepare the transparent conducting oxide materials are fully described in J. L. Vossen, "Transparent Conducting Films", *Physics of Thin Films*, vol. 9 (1977) (edited by G. Hass et al). For example, in the case of indium tin oxide, a mixture of In and Sn having an Sn:In weight ratio of 1:5 or less may be used. In the case of doped $SnO_2$, a mixture of SnO, and Sb having a Sb:$SnO_2$ weight ratio of 1:9 or less may be used.

The sputtering gas is at least one inert gas such as Argon, Xenon, Krypton, helium, and Nitrogen. Preferably the sputtering gas is Ar. More preferably, the sputtering gas is a mixture of from 50 to 100 percent by weight Ar and from 0 to 50 percent by weight He. Most preferably, the sputtering gas is a mixture of He and Ar comprising 2 to 5 percent by weight He.

The gaseous mixture may also include $O_2$ gas, depending upon whether the precursor is a metal or a metal oxide. When the precursor is a metal, the use of O₂ is required. The O₂ reacts with the metal to form light transmissive, electrically conductive oxides of the present invention. On the other hand, when the precursor is a metal oxide, the use of $O_2$ is not required Still, the use of $O_2$ is preferred even when the precursor is a metal oxide in that metal oxide films have better light transmissive and electrical conductivity characteristics when formed in the presence of $O_2$.

Figure 1B:
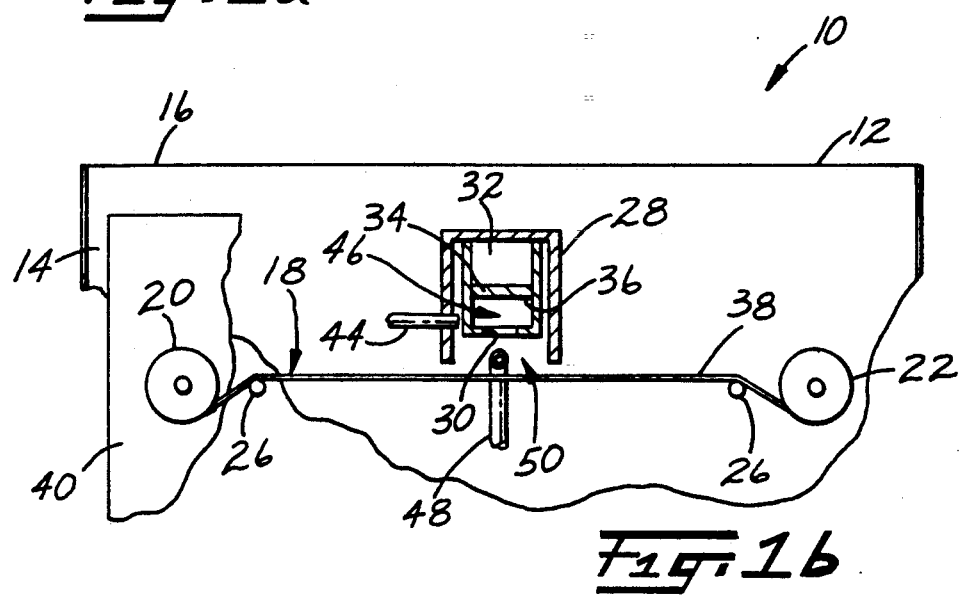
Figure 1C:
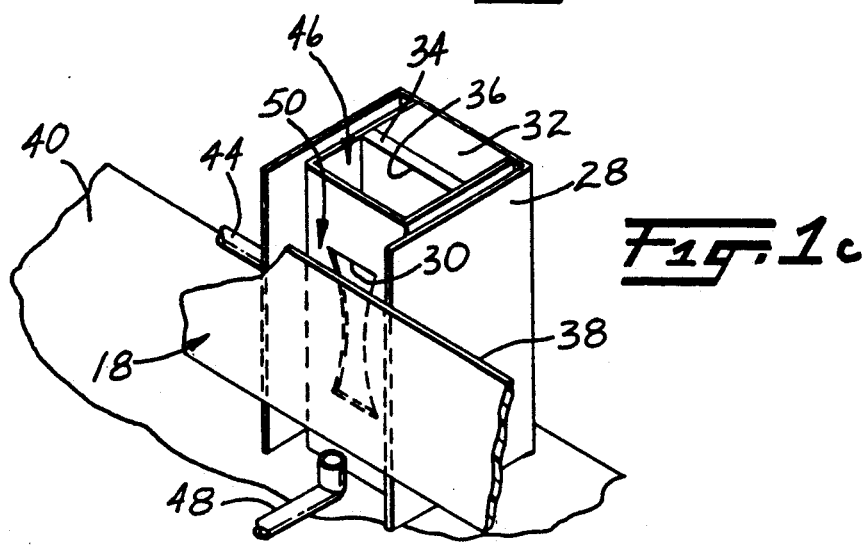
FIG. 1c is a perspective view of a portion of the sputtering system shown in FIGS. 1a and 1b in which the sputtering of the target onto the substrate occurs.

FIGS. 1a, 1b, and 1c show one in-line dc magnetron sputtering system 10 that has been found to be particularly useful in the practice of the present invention. The system 10 includes an aluminum, box-shaped housing 12 secured to an outer base plate 14. Together, the housing and the outer base plate 14 form an air tight sputtering chamber 16. A substrate 18, e.g., a polymer web, is transported from a supply roll 20 to a take-up roll 22. The take-up roll 22 and the supply roll 20 are powered by drive motors 24. Idler rolls 26 help guide the substrate 18 during transport.

Inside the chamber 16, a shield 28 having a uniformity aperture 30, contains a cathode 32 in ohmic contact with a target 34. The target 34 is formed from a suitable light transmissive, electrically conductive oxide precursor. The shield 28 is positioned such that the surface 36 of the target 34 and the uniformity aperture 30 are substantially parallel to the surface 38 of the substrate 18. The target 34 is placed at a distance of about 2.5 inches (6.3 cm) from the substrate 18 and about 1.8 inches (4.6 cm) from the uniformity aperture 30. The shield 28 and the idler rolls 26 are mounted onto an inner base plate 40. A pumping means 42, e.g., a cryopump, is used to place the sputtering chamber 16 under a vacuum.

As seen best in FIGS. 1b and 1c, gas delivery lines 44 (one of which is shown) deliver the sputtering gas to the region 46 inside the shield 28 between the target 34 and the uniformity aperture 30. Gas delivery lines 48 (one of which is shown) deliver a mixture of the stabilizing gas and the sputtering gas to the region 50 between the uniformity aperture 30 and the substrate 18. The gas delivery lines 48 also deliver the fluorine containing gas, if any, and/or O₂ gas, if any, as well. Preferably, gas is delivered at a higher flow rate through the gas delivery lines 44 than through the gas delivery lines 48 in order to keep O₂ gas away from the target. Generally, the flow rate of gas at the gas delivery lines 44 to the flow rate of gas at the gas delivery lines 48 is from 2:1 to 3:1.

In use, the sputtering chamber 10 is first pumped down to a pressure of $10^{-6}$ Torr or less. Then, the gases are pumped into the chamber 10 to a total pressure of about 50 millitorr or less. Pressures of from about 5 to 15 millitorr have been found to be particularly suitable in the practice of the present invention.

The relative amounts of the gases to be used will depend upon the geometry of the sputtering chamber. Trial and error techniques may be used to determine optimum amounts of the gases to be used. Generally, however, if too little stabilizing gas is used, the resulting oxide will show a resistivity that is too high. On the other hand, using too much stabilizing gas provides little additional benefit as compared to using lesser amounts of stabilizing gas. Moreover, using too much stabilizing gas may also result in an oxide having poor light transmissive properties.

Preferably, the stabilizing gas is delivered in an amount such that the molar ratio of the stabilizing gas to the sputtering gas is from 0.005 to 1.0. For purposes of calculating this ratio, the total moles of the sputtering gas is calculated from the amount of the sputtering gas delivered from both the gas delivery lines 44 and the gas delivery lines 48. When O₂ gas is used, the O₂ gas is preferably used in an amount such that the molar ratio of the stabilizing gas to the O₂ gas is from 0.1 to 2.0. When a fluorine containing gas is used, the fluorine containing gas is preferably used in amount such that the molar ratio of F atoms from the fluorine containing gas to the H atoms from the stabilizing gas is 0.005 to 1.0.

Figure 2:
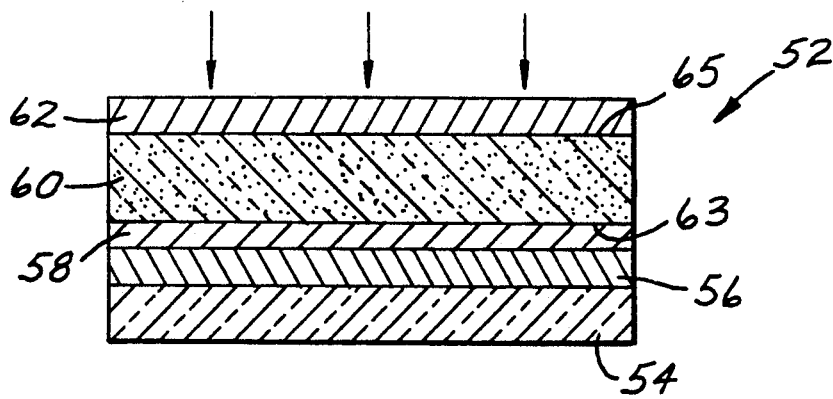
FIG. 2 is a cross-section of a photovoltaic device of the present invention.

A photovoltaic device 52 comprising a light transmissive, electrically conductive oxide composition of the present invention is shown in FIG. 2. The photovoltaic device 52 comprises a support 54. The support 54 may be formed from any of the known support materials such as glass, quartz, and stainless steel. Additionally, since the present invention allows the light transmissive, electrically conductive oxide to be deposited at low temperatures, the support 54 may also be formed from flexible polymer materials such as polyester, fluorinated polyester, polyvinyl fluoride, polyvinylidene fluoride, polysulphone, aramid, polyimide, and the like.

A first electrode 56 is deposited onto the support. The first electrode 56 is preferably aluminum, but may also be other electrically conductive materials such as copper, chromium, stainless steel, and the like.

A diffusion barrier 58 is optionally deposited onto the first electrode. The diffusion barrier 58 is used to prevent aluminum ions, silver ions, and the like from diffusing from the first electrode 56 into the photovoltaic semiconductor structure 60 subsequently deposited over the diffusion barrier 58. Suitable materials for the diffusion barrier 58 include stainless steel, refractory metals, titanium nitride, and the like. It is to be understood that the diffusion barrier 58 is not required when the first electrode 56 is made from a material which does not tend to diffuse into the photovoltaic semiconductor structure 60 subsequently deposited over the first electrode 56.

A photovoltaic semiconductor structure 60 is deposited onto the diffusion barrier 58. The photovoltaic semiconductor structure 60 may be any of the known types for converting incident light into electrical energy. For example, the photovoltaic semiconductor structure may be a p-i-n or n-i-p structure comprising an undoped semiconductor layer interposed between an n-type semiconducting layer and a p-type semiconducting layer. The doped layers are prepared according to methods well known in the art. For example, U.S. Pat. No. 4,513,073 generally describes methods for preparing p-type and n-type doped amorphous silicon. Alternatively, the photovoltaic structure may be a Schottky barrier structure comprising an n-type or p-type semiconducting layer in ohmic contact with an undoped semiconducting layer.

The various semiconducting layers may comprise any of the known photovoltaic semiconducting materials of either the organic or inorganic type, or mixtures thereof, in either continuous web form or particulate binder form. Particularly useful materials are amorphous materials which contain at least one of silicon or germanium atoms as a matrix and which contain at least one of hydrogen (H) or halogen (X) atoms. Such materials include hydrogenated amorphous silicon (a-Si:H), halogenated amorphous silicon (a-Si:X), hydrogenated amorphous germanium (a-Ge:H), halogenated amorphous germanium (a-Ge:X), as well as corresponding silicon-germanium alloys of the above materials. Germanium may be useful in preparing materials that are sensitive to the near infrared region of the visible spectrum. Other useful materials include cadmium telluride (CdTe), copper indium selenide ($CuInSe_2$), polysilicon, and single crystal silicon.

A semiconducting material which has been found to be particularly useful in the practice of the present invention is hydrogenated amorphous silicon (a-Si:H). This type of material is described in U.S. Pat. Nos. 4,377,628; 4,365,015; 4,365,013; 4,297,392; and 4,265,991. Hydrogen is present in such materials as H bonded to Si or ionized and weakly bound to Si or as interstitial $H_2$. The hydrogen content may vary, as is known to those skilled in the art, between about 5 and 40 atomic percent in order to obtain desired photovoltaic properties. A preferred method for making such materials is by RF glow discharge of silane. However, other well known techniques such as sputtering and chemical vapor deposition may also be used advantageously.

A second electrode 62 comprising a light transmissive, electrically conductive composition of the present invention is deposited onto the photovoltaic semiconductor structure. Both the first and second electrodes are in electrical contact with the first and second sides 63 and 65 of the photovoltaic semiconductor structure 60, respectively.

Figure 3:
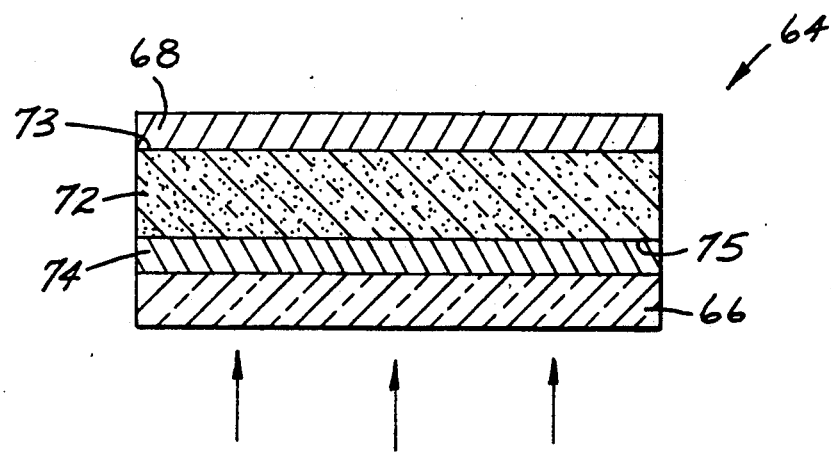
FIG. 3 is a cross-section of another photovoltaic device of the present invention.

An alternate structure of the present invention is shown in FIG. 3. There, a photovoltaic device 64 comprises a support 66. In this embodiment, the support 66 is a transparent or semitransparent material. A second electrode 74 comprising a light transmissive, electrically conductive composition of the present invention is deposited onto the support 66. A photovoltaic semiconductor structure 72 is deposited onto the second electrode 74. A first electrode 68 is deposited onto a first side 73 of the photovoltaic semiconductor structure. The first and second electrodes 68 and 74 are in electrical contact with first and second sides 73 and 75 of the photovoltaic semiconducting structure 72, respectively. A diffusion barrier (not shown) optionally may be interposed between the photovoltaic semiconducting structure 72 and the first electrode 68, if required. The composition and the physical characteristics of each of the layers 66, 68, 70, 72, and 74 is the same as the corresponding layers described above with reference to FIG. 2.

The invention will now be described with reference to the following examples.

EXAMPLE 1

Hydrogen doped $SnO_2$ films of the present invention were formed on a 4 mil polyester web using the sputtering system shown in FIGS. 1a, 1b, and 1c. The sputter target 34 was made from $SnO_2$ with about 3 weight percent Sb. Argon was delivered at a flow rate of about 20 sccm through the gas delivery lines 44. An Argon/$H_2$ gas mixture and oxygen was delivered through the gas delivery lines 48. Oxygen was delivered at a flow rate of 5-7 sccm. The Argon/$H_2$ gas mixture was 5 molar percent $H_2$. The flow rate of the Argon/$H_2$ gas mixture was varied such that various hydrogen doped $SnO_2$ films were made at molar ratios, N, of $H_2$ to $O_2$ of from 0.25 to 1.25. The sputtering conditions were as follows:

| | |
|---|---|
| Temperature | room temperature |
| Power Density | 1.14 W/cm$^2$ |
| Gas Pressure | 12 millitorr |
| Deposition Rate | 26 A/sec |
| Web Speed | 5 cm/min |

The resulting oxide films were then annealed at 100° C. for 18 hours.

Figure 4:
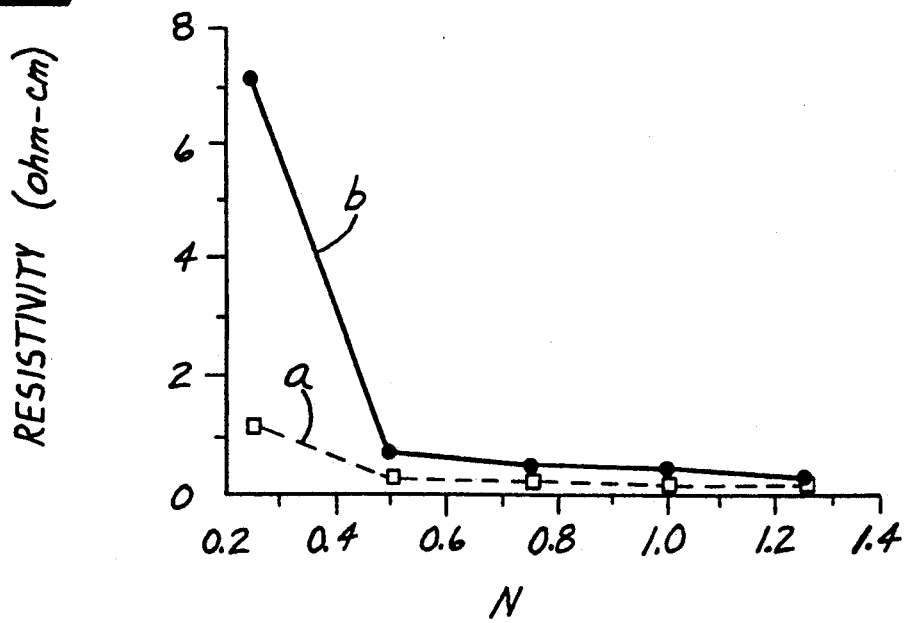
FIG. 4 is a graph showing the resistivity of the present invention as a function of N.

The variation of resistivity of the oxide films before annealing for N equal to 0.25 to 1.25 is shown as curve (a) in FIG. 4. Curve (a) shows that the resistivity of the films decreased with increasing N and became saturated at a ratio, N, of about 1.25. The variation of resistivity of the oxide films with N after annealing is shown as curve (b) of FIG. 4. Curve (b) shows that annealing caused the resistivity of the films to increase. However, the increase was significantly less pronounced at higher ratios, N, of $H_2$ to $O_2$.

The variation of absorption (at 400 nm) of the oxide films with N before annealing is shown in FIG. 5. FIG. 5 shows that the absorption of the films decreased with increasing N. The absorption of the films did not change after annealing.

EXAMPLE 2

A hydrogen doped Indium Tin Oxide (ITO) film of the present invention was formed on a 4 mil polyester web using the sputtering system shown in FIGS. 1a, 1b, and 1c. Argon was delivered through the gas delivery lines 44 at a flow rate of about 20 sccm. Oxygen was delivered through the gas delivery lines 48 at a flow rate of about 5 to 7 sccm. An Argon/$H_2$ mixture containing about 5 molar percent $H_2$ was also delivered through the gas delivery lines 48 at a flow rate such that the molar ratio, N, of $H_2$ to $O_2$ was maintained at 0.28. The sputtering target 34 was made from indium with about 9 percent by weight Sn. The sputtering conditions were as follows:

| | |
|---|---|
| Temperature | room temperature |
| Power Density | 1.94 W/cm$^2$ |
| Gas Pressure | 8 millitorr |
| Deposition Rate | 13.3 A/sec |
| Web Speed | 5 cm/min |

The resulting oxide film showed an absorption of 8% and 85% light transmission at a wavelength of 400 nm and showed a resistivity of $7.5 \times 10-4$ ohm-cm. The film was then stored in air at room temperature for 6 months. The resistivity of the film surprisingly did not change during this time.

EXAMPLE 3

A hydrogen doped ITO film prepared in accordance with Example 2 was annealed in air at 100° C. for 144 hours. Before annealing, the film showed a resistivity of $7.5 \times 10-4$ ohm-cm. After annealing, the resistivity of the film increased only by a factor of 2.

EXAMPLE 4

An Indium Tin Oxide film was formed on a glass substrate (Corning No. 7059) using a sputtering apparatus commercially available as Model No. 2400 from Perkin-Elmer Co. Argon sputtering gas was delivered at 11.6 sccm. An Argon/$H_2$ mixture (5 molar percent $H_2$) was delivered at 6 sccm. $CF_4$ gas was delivered at 0.3 sccm. A 10 inch ITO sputtering target was used. The sputtering conditions were as follows:

| | |
|---|---|
| Temperature | room temperature |
| Power | 200 W |
| Gas Pressure | 7 millitorr |

The resulting oxide film showed a transmission of 85% at 500 nm and a resistivity of $8 \times 10^{-4}$ Ω-cm.

COMPARISON EXAMPLE

An ITO film was prepared in accordance with Example 2, except no hydrogen was used, i.e., N=0. The film was then annealed in accordance with Example 3. Before annealing, the film showed a resistivity of $8 \times 10^{-3}$ ohm-cm and an absorption (at 400 nm) of 10%. After annealing, the resistivity increased by a factor of 10 to $8 \times 10^{-2}$ ohm-cm. The absorption (at 400 nm), however, did not change.

Other embodiments of this invention will be apparent to those skilled in the art from a consideration of this specification or from practice of the invention disclosed herein. Various omissions, modifications, and changes to the principles described herein may be made by one skilled in the art without departing from the true scope and spirit of the invention which is indicated by the following claims.

What is claimed is:

1. A process for making a light transmissive, electrically conductive electrode, comprising the step of sputtering an indium tin oxide precursor onto a substrate at a temperature from 20° C. to 300° C., wherein said sputtering step occurs in a gaseous mixture comprising
   a) a sputtering gas; and
   b) a stabilizing gas comprising at least one gas selected from the group consisting of $H_2$ and $H_2O$; and
   c) a fluorine containing gas.

2. The process of claim 1, wherein the indium tin oxide precursor comprises a mixture of In and Sn having a Sn:In weight ratio of 1:5 or less.

3. The process of claim 1, wherein said sputtering step occurs at a temperature of from 25° C. to 150° C.

4. The process of claim 1, wherein said sputtering step occurs at a temperature of about 25° C.

5. The process of claim 1, wherein the sputtering gas is argon.

6. The process of claim 1, wherein the sputtering gas is a mixture of from 50 to 100 percent by weight Ar and from 0 to 50 percent by weight He.

7. The process of claim 6, wherein said mixture of Ar and He comprises from 2 to 5 percent by weight of He.

8. The process of claim 1, wherein said sputtering step occurs at a pressure of 50 millitorr or less.

9. The process of claim 1, wherein the molar ratio of F atoms from the fluorine containing gas to the number of moles of hydrogen atoms from the stabilizing gas is from 0.005 to 1.0.

10. The process of claim 1, wherein the fluorine containing gas is selected from the group consisting of $F_2$, $CF_4$, and $BF_6$.

11. The process of claim 1, wherein the molar ratio of the stabilizing gas to the sputtering gas is from 0.005 to 1.0.

12. The process of claim 1, wherein the molar ratio of the stabilizing gas to the sputtering gas is 0.05.

13. The process of claim 1, wherein the gaseous mixture further comprises oxygen gas.

14. The process of claim 13, wherein the molar ratio of the stabilizing gas to oxygen gas is 0.1 to 2.0.

15. A light transmissive, electrically conductive electrode, wherein the electrode is formed from indium tin oxide that is doped with fluorine and hydrogen.

16. A photovoltaic device, comprising:
   (a) a photovoltaic semiconductor structure having a first side and a second side;
   (b) a first electrode in electrical contact with the first side of the photovoltaic semiconductor structure, wherein said first electrode is formed from a conductive material; and
   (c) a second electrode in electrical contact with the second side of the photovoltaic semiconductor structure, said second electrode comprising indium tin oxide that is doped with fluorine and hydrogen.

* * * * *

UNITED STATES PATENT AND TRADEMARK OFFICE
CERTIFICATE OF CORRECTION

PATENT NO. : 5,135,581
DATED : August 4, 1992
INVENTOR(S) : Tran et al.

It is certified that error appears in the above-identified patent and that said Letters Patent is hereby corrected as shown below:

Col. 2, line 27, "aspect of the" should be --aspect the--.

Col. 4, line 57, "SnO" should be --$SnO_2$--.

Col. 5, line 4, "required Still" should be --required. Still--.

Signed and Sealed this

Fifth Day of October, 1993

Attest:

BRUCE LEHMAN

Attesting Officer — Commissioner of Patents and Trademarks